US012685182B2

(12) United States Patent
Lin et al.

(10) Patent No.: US 12,685,182 B2
(45) Date of Patent: Jul. 14, 2026

(54) METHOD FOR MANUFACTURING PACKAGE STRUCTURE COMPRISING IRRADIATING PACKAGE STRUCTURE BY LIGHT BEAM

(71) Applicant: Advanced Semiconductor Engineering, Inc., Kaohsiung (TW)

(72) Inventors: Tung Yao Lin, Kaohsiung (TW); Yi Dao Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 369 days.

(21) Appl. No.: 18/456,446

(22) Filed: Aug. 25, 2023

(65) Prior Publication Data

US 2025/0069901 A1    Feb. 27, 2025

(51) Int. Cl.
| | |
|---|---|
| *B23K 1/005* | (2006.01) |
| *B23K 1/00* | (2006.01) |
| *H10P 72/00* | (2026.01) |
| *H10W 70/05* | (2026.01) |
| *H10W 72/00* | (2026.01) |
| *H10W 72/20* | (2026.01) |
| *H10W 72/30* | (2026.01) |
| *H10W 90/00* | (2026.01) |

(52) U.S. Cl.
CPC ......... *H10W 70/093* (2026.01); *B23K 1/0008* (2013.01); *B23K 1/0056* (2013.01); *H10P 72/0436* (2026.01); *H10W 72/20* (2026.01); *H10W 72/30* (2026.01); *H10W 72/851* (2026.01); *H10W 90/701* (2026.01); *H10W 90/00* (2026.01)

(58) Field of Classification Search
None
See application file for complete search history.

(56) References Cited

U.S. PATENT DOCUMENTS

| | | | |
|---|---|---|---|
| 11,652,081 B2 | 5/2023 | Wang et al. | |
| 2022/0399303 A1* | 12/2022 | Wang | ................... H01L 25/0655 |
| 2024/0371785 A1* | 11/2024 | Liao | ........................ H01L 24/19 |
| 2025/0069899 A1* | 2/2025 | Gu | ...................... H01L 23/3128 |

* cited by examiner

*Primary Examiner* — Daniel Whalen
(74) *Attorney, Agent, or Firm* — Foley and Lardner LLP

(57) ABSTRACT

A method for manufacturing a package structure is provided. The method includes providing a package structure including a first region and a second region different from the first region, wherein the package structure comprises a package substrate having an active surface and a backside surface; and irradiating the package structure by a first light beam along a first direction from the active surface toward the backside surface, wherein the first light beam only irradiates the first region without irradiating the second region.

6 Claims, 16 Drawing Sheets

METHOD FOR MANUFACTURING PACKAGE STRUCTURE COMPRISING IRRADIATING PACKAGE STRUCTURE BY LIGHT BEAM

BACKGROUND

1. Technical Field

The present disclosure relates generally to a method for manufacturing a package structure.

2. Description of the Related Art

Based on rapid heating properties thereof, laser assisted bonding (LAB) is frequently employed used to replace conventional reflow process in melting of bumps, solder balls, pads, and/or other electrical connection elements to achieve fine pitch flip chip bonding. However, due to different thermal conductivities of different materials, LAB can damage materials such as epoxy molding compound or substrates. To address the aforementioned problems, an improved method of manufacturing a semiconductor package is called for.

SUMMARY

In one or more arrangements, a method for manufacturing a package structure includes providing a package structure including a first region and a second region different from the first region, wherein the package structure comprises a package substrate having an active surface and a backside surface; and irradiating the package structure by a first light beam along a first direction from the active surface toward the backside surface, wherein the first light beam only irradiates the first region without irradiating the second region.

In one or more arrangements, a method for manufacturing a package structure includes providing a package structure including a first region and a second region different from the first region; irradiating the package structure along a first path; irradiating the package structure along a second path different from the first path; and shielding the first region without shielding the second region in the second path.

In one or more arrangements, a method for manufacturing a package structure includes providing a package structure including a first region and an optical-transmissive region having a light transmittance greater than a light transmittance of the first region; and irradiating the package structure by a light beam along a first direction, wherein the light beam overlaps the first region without overlapping the optical-transmissive region.

BRIEF DESCRIPTION OF THE DRAWINGS

Aspects of the present disclosure are better understood from the following detailed description when read with the accompanying drawings. It is noted that various features may not be drawn to scale, and the dimensions of the various features may be arbitrarily increased or reduced for clarity of discussion.

DETAILED DESCRIPTION

FIG. 1A, FIG. 1B, FIG. 2A, FIG. 2B, FIG. 3, FIG. 4, FIG. 5, FIG. 6, and FIG. 7 illustrate various stages of an exemplary method for manufacturing a package structure in accordance with some arrangements of the present disclosure.

Figure 1A:
FIG. 1A, FIG. 1B, FIG. 2A, FIG. 2B, FIG. 3, FIG. 4, FIG. 5, FIG. 6, and FIG. 7 illustrate various stages of an exemplary method for manufacturing a package structure in accordance with some arrangements of the present disclosure.
Figure 1B:
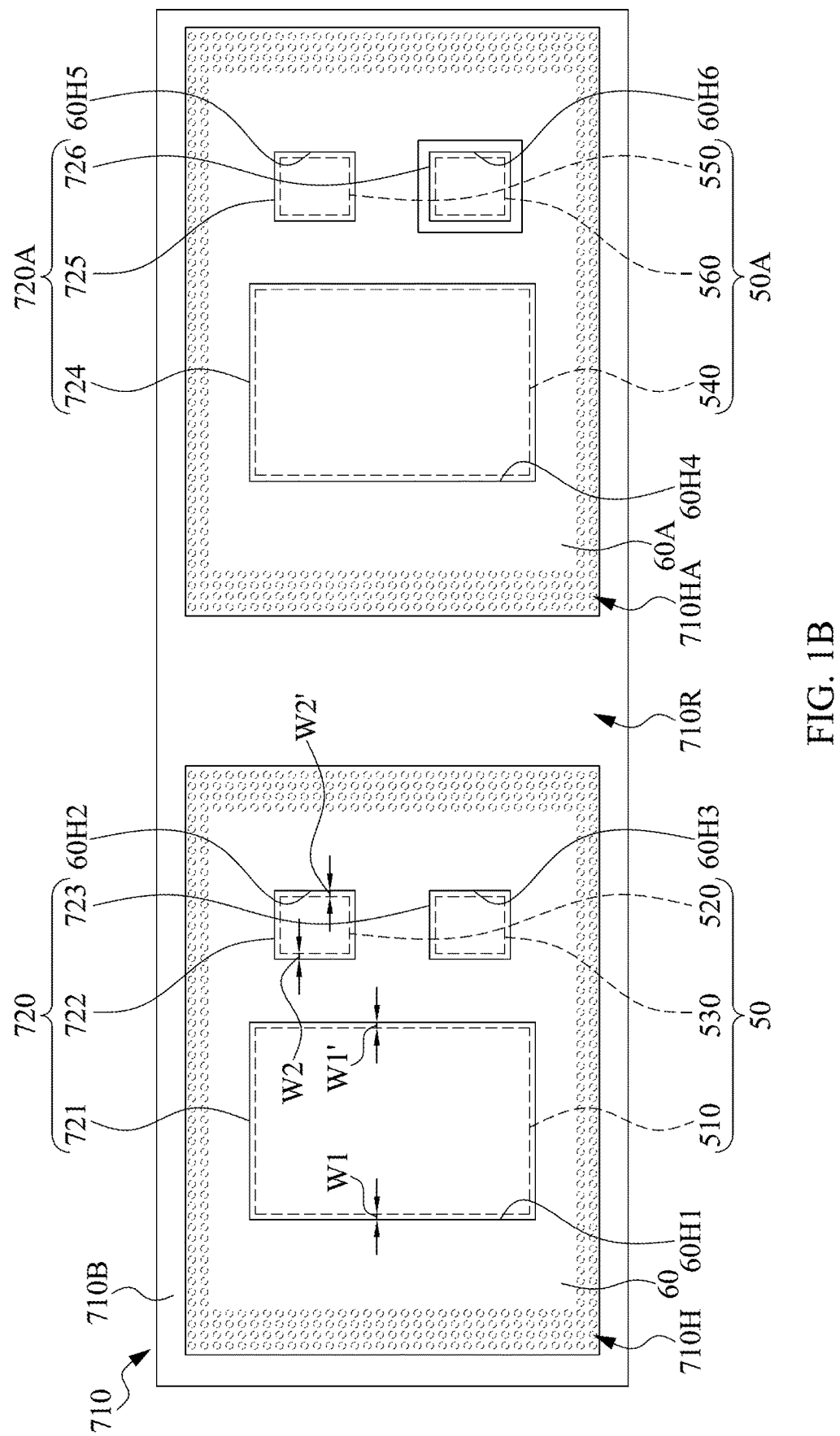

FIG. 1A and FIG. 1B, which illustrate various stages of an exemplary method for manufacturing a package structure, are a cross-section and top view respectively of a processing apparatus 40 which may be provided thereby. The processing apparatus 40 may include an upper structure 40A and a lower structure 40B. The upper structure 40A and the lower structure 40B may define a space 40S accommodating one or more package structures (e.g., package structures 1 and 1A) in a manufacturing process.

In some arrangements, the upper structure 40A includes a plurality of optical-transmissive regions and a plurality of shielding regions. The optical-transmissive regions may be or include regions of openings 60H1, 60H2, 60H3, 60H4, 60H5, and 60H6 (also referred to as "through holes"). The shielding regions may be or include shielding regions 60 and 60A (also referred to as "masks," "upper masks," or "top masks"). The masks (i.e., the shielding regions 60 and 60A) may define the openings 60H1, 60H2, 60H3, 60H4, 60H5, and 60H6. In some arrangements, the upper structure 40A further includes a plurality of compression elements 720 and 720A (also referred to as "optical-transmissive compression elements") disposed within the optical-transmissive regions (or the openings 60H1, 60H2, 60H3, 60H4, 60H5, and 60H6) and configured to reduce warpage of the one or more package structures during manufacture. In some arrangements, the compression elements 720 and 720A are or include quartz blocks and/or quartz layers. The designs (e.g., the patterns, the numbers, the shapes, and etc.) of the optical-transmissive regions and the shielding regions of the upper structure 40A may vary according to actual need and are not limited thereto.

In some arrangements, the lower structure 40B is disposed under the upper structure 40A. In some arrangements, the lower structure 40B includes a plurality of shielding regions 50 and 50A (also referred to as "masks," "lower masks," or "bottom masks") free from vertically overlapping the shielding regions 60 and 60A. In some arrangements, the lower structure 40B further includes a supporter 710 (also referred to as "an optical-transmissive supporter) configured to guide one or more package structures to contact the upper structure 40A during manufacture. In some arrangements, the supporter 710 includes a base layer 710B (also referred to as "an optical-transmissive base layer") and a vacuum suction structure. In some arrangements, the vacuum suction structure includes a plurality of vacuum suction passages 710H and 710HA (also referred to as "through holes") penetrating the base layer 710B. In some arrangements, the supporter 710 is between the shielding regions 60 and 60A (or the upper masks) and the shielding regions 50 and 50A (or the lower masks) and configured to reduce warpage of one or more package structures during manufacture. In some arrangements, the shielding regions 60 and 60A (or the upper masks) and the shielding regions 50 and 50A (or the lower masks) are free from vertically overlapping. In some arrangements, the vacuum suction passages 710H and 710HA are free from vertically overlapping the shielding regions 50, 50A, 60, and 60A. In some arrangements, each of the compression elements 720 and 720A is disposed over each of the corresponding shielding regions 50 and 50A. In some arrangements, the compression elements 720 include compression elements 721, 722, and 723 each in the openings 60H1, 60H2, and 60H3, respectively. In some arrangements, the compression elements 720A include compression elements 724, 725, and 726 each in the openings 60H4, 60H5, and 60H6, respectively. In some arrangements, the shielding regions 50 include shielding regions 510, 520, and 530 each under the openings 60H1, 60H2, and 60H3, respectively. In some arrangements, the shielding regions 50A include shielding regions 540, 550, and 560 each under the openings 60H4, 60H5, and 60H6, respectively. In some arrangements, the compression elements 721, 722, 723, 724, 725, and 726 are over the shielding regions 510, 520, 530, 540, 550, and 560, respectively. In some arrangements, referring to FIG. 1B, each of the shielding regions 510, 520, 530, 540, 550, and 560 has an edge spaced apart from an edge of each of the corresponding openings 60H1, 60H2, 60H3, 60H4, 60H5, and 60H6 from a top view perspective. In some arrangements, referring to FIG. 1B, an area of each of the shielding regions 510, 520, 530, 540, 550, and 560 is less than an area of each of the corresponding openings 60H1, 60H2, 60H3, 60H4, 60H5, and 60H6 from a top view perspective. In some arrangements, the supporter 710 is or includes a quartz block and/or a quartz layer. In some arrangements, the supporter 710 is a single-piece block or layer. In some arrangements, the supporter 710 may include a plurality of portions that are separated or spaced apart from one another. The portions of the supporter 710 may be arranged corresponding to the package structures. For example, each of the portions of the supporter 710 may be arranged corresponding to each of the package structures. In some arrangements, the lower structure 40B may further include an optical-transmissive region within a range covered by the supporter 710 and free from being covered by the shielding regions 50 from a top view perspective. The designs (e.g., the patterns, the numbers, the shapes, and etc.) of the optical-transmissive region and the shielding regions of the lower structure 40B may vary according to actual need and are not limited thereto.

The optical-transmissive regions hereinafter may be configured to allow transmission of a light beam (e.g., an energy beam) having a predetermined wavelength or wavelength range. In some arrangements, the optical-transmissive regions have a light transmittance of greater than about 90%, 95%, 97%, or 99%, with respect to a peak wavelength or a range of wavelengths of an energy beam. The energy beam may be a laser beam, such as an NIR laser. The range of wavelength of an energy beam may be in the infrared range (e.g., from about 705 nm to about 2000 nm). The shielding regions hereinafter may be configured to shield or prevent transmission of an energy beam having a predetermined wavelength or wavelength range. In some arrangements, the shielding regions have a light transmittance of no greater than about 10%, 5%, 3%, or 1%, with respect to a peak wavelength or a range of wavelengths of an energy beam. The energy beam may be a laser beam, such as an NIR laser. The wavelength of an energy beam may be in the infrared range (e.g., from about 705 nm to about 2000 nm). The shielding regions may be made of or include a metal material, such as aluminum (Al), steel, or other suitable metal material that is configured to shield or prevent an energy beam having the aforesaid wavelength range. The steel may be SK5 or any other suitable carbon tool steel.

According to some arrangements of the present disclosure, the shielding regions are made of or include a metal material with relatively high heat resistance and heat dissipation efficiency, and can block or reflect energy beams (e.g., laser beams).

Figure 2A:
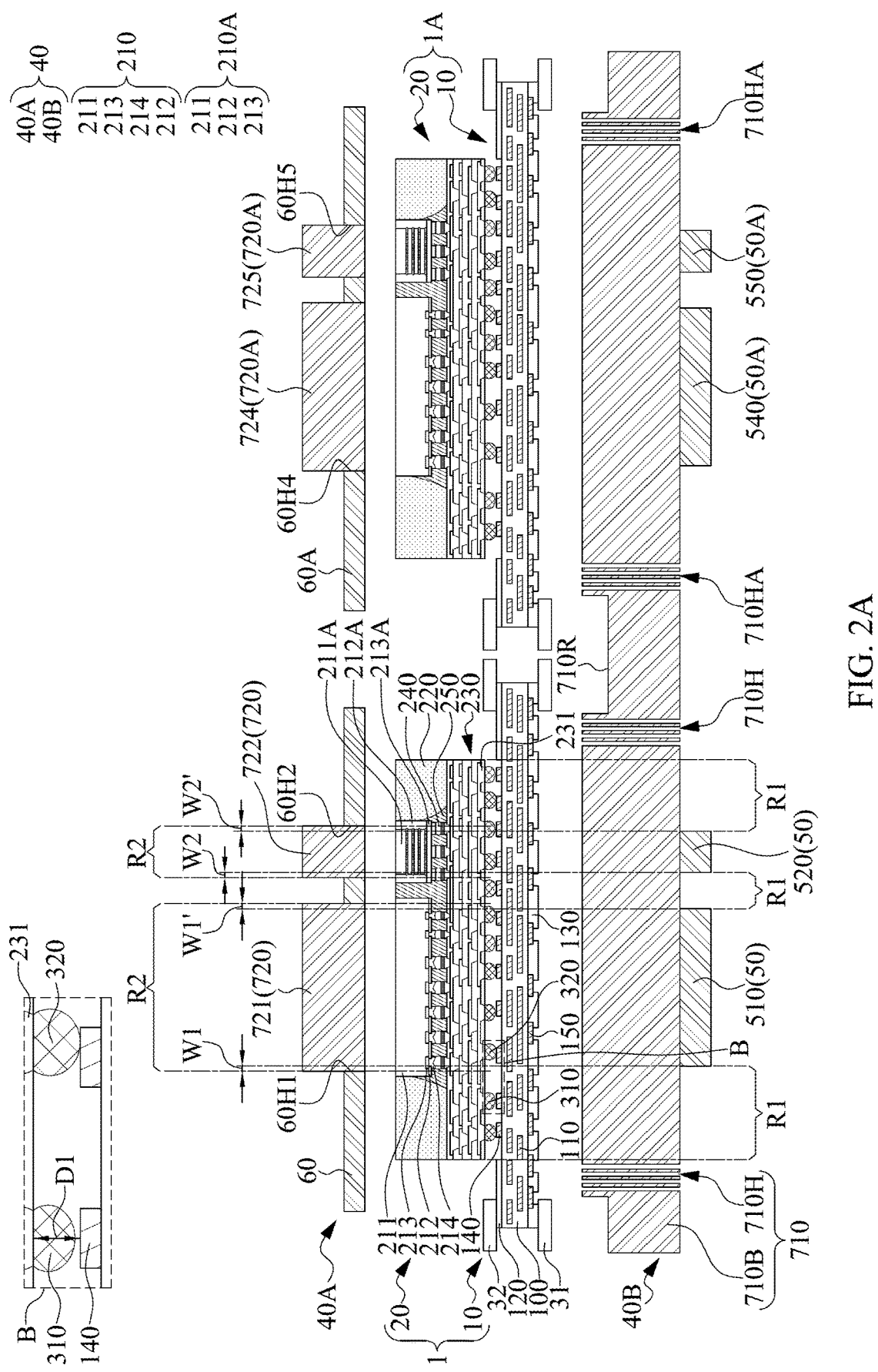
Figure 2B:
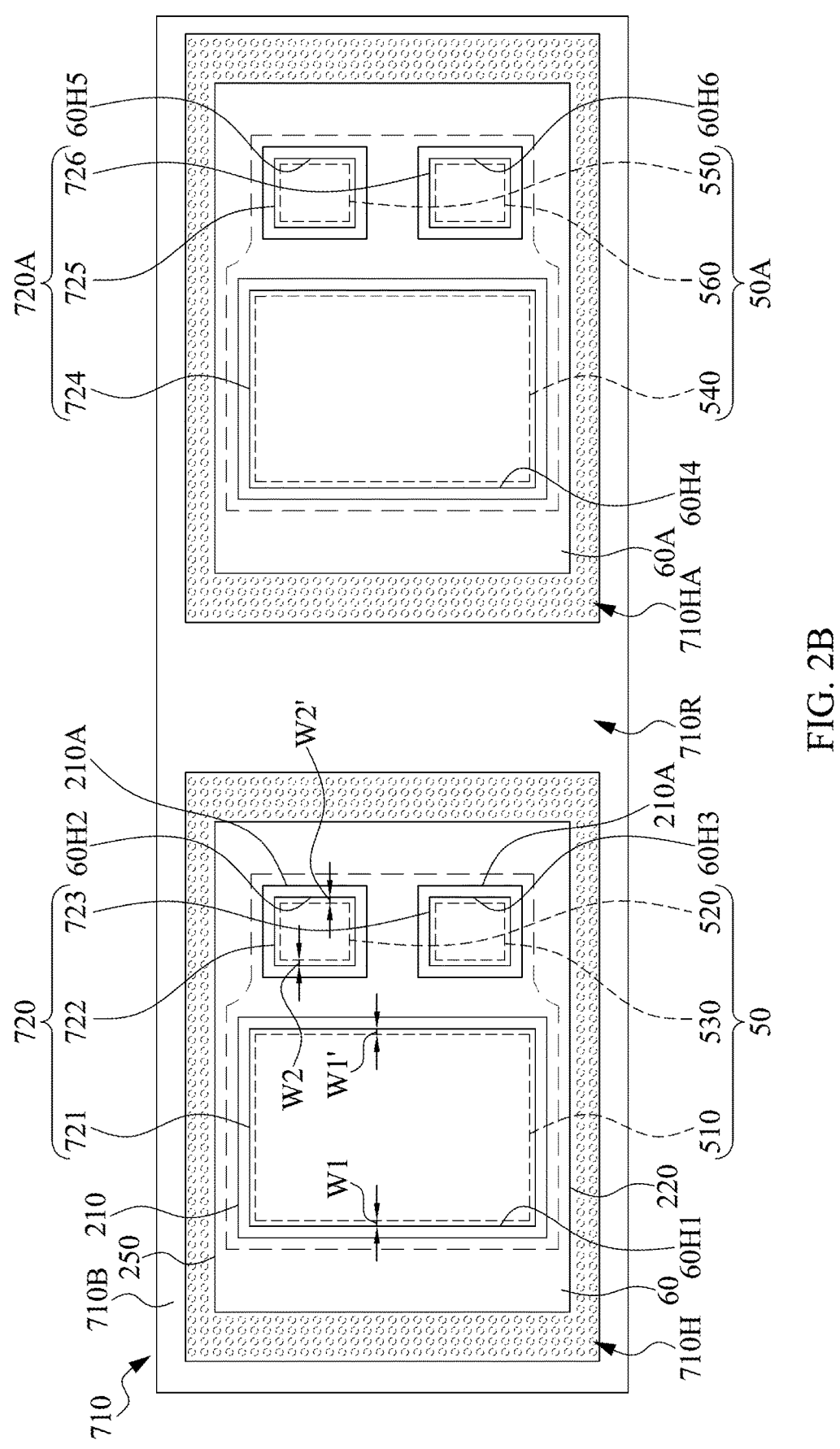

FIG. 2A and FIG. 2B, which illustrate various stages of an exemplary method for manufacturing a package structure, are a cross-section and top view respectively of one or more package structures (e.g., package structures 1 and 1A) which may be provided thereby. The package structures 1 and 1A may be disposed in or transported into the processing apparatus 40. In some arrangements, each of the package structures 1 and 1A may be disposed in or fixed to a carrier boat 31 by a cover jig 32. The package structures 1 and 1A may be conveyed into the processing apparatus 40 by the carrier boat 31. The supporter 710 may have one or more recesses 710R configured to accommodate or receive the carrier boats 31. In some arrangements, the upper structure 40A (or the shielding regions 60 and 60A) and the lower structure 40B (or the shielding regions 50 and 50A) are located on opposite sides of the package structures 1 and 1A. In some arrangements, each of the package structures 1 and 1A may include substrates 10 and 20 (or package substrates).

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a plurality of conductive traces or a through via. In some arrangements, the substrate 10 includes a ceramic material or a metal plate. In some arrangements, the substrate 10 may include an organic substrate or a leadframe. In some arrangements, the substrate 10 may include a two-layer substrate which includes a core layer and a conductive material and/or structure disposed on an upper surface and a bottom surface of the substrate 10. The conductive material and/or structure may include a plurality of traces.

In some arrangements, the substrate 10 includes a dielectric structure 100, a wiring structure 110 (also referred to as "a RDL") in the dielectric structure 100, dielectric layers 120 and 130 on opposite surfaces of the dielectric structure 100, and conductive pads 140 and 150 on opposite surfaces of the dielectric structure 100. In some arrangements, the wiring structure 110 includes a plurality of wiring layers (or conductive layers), and the dielectric structure 100 may include a plurality of dielectric layers (not shown) disposed between the wiring layers of the wiring structure 110. In some arrangements, the dielectric layer 120 defines one or more openings that expose a portion of an upper surface of the dielectric structure 100, and the conductive pads 140 are disposed on the exposed upper surface of the dielectric structure 100 and electrically connected to the wiring structure 110. In some arrangements, the conductive pads 150 are disposed on a bottom surface of the dielectric structure 100 and electrically connected to the conductive pads 140 through the wiring structure 110, and the dielectric layer 130 covers the bottom surface of the dielectric structure 100 and portions of the conductive pads 150. In some arrangements, the dielectric layer 130 defines a plurality of openings, and portions of the conductive pads 150 are exposed by the openings of the dielectric layer 130. In some arrangements, the dielectric layers may independently include an organic material, a solder mask, PI, an ABF, one or more molding compounds, one or more pre-impregnated composite fibers (e.g., a pre-preg material), borophosphosilicate glass (BPSG), silicon oxide, silicon nitride, silicon oxynitride, undoped silicate glass (USG), any combination thereof, or the like. The conductive layers and/or pads may independently include a conductive material such as a metal or metal alloy. Examples include gold (Au), silver (Ag), aluminum (Al), copper (Cu), or an alloy thereof.

In some arrangements, the substrate 20 includes electronic components 210 and 210A, an encapsulant 220, a redistribution layer (RDL) 230, connection elements 240, and an underfill 250. The electronic components 210 and 210A may be or include semiconductor devices. In some arrangements, the encapsulant 220 encapsulates the electronic components 210 and 210A, and the underfill 250 encapsulates the connection elements 240. The substrate 20 may have an active surface adjacent to the RDL 230 and a backside surface adjacent to the electronic component 210. In some arrangements, the electronic component 210 includes a substrate layer 211 (e.g., a silicon-based layer), a passivation layer 212 on a bottom surface of the substrate layer 211, conductive pads 213 exposed by openings of the passivation layer 212, and under bump metallizations (UBMs) 214 on the exposed surfaces of the conductive pads 213. The electronic component 210 may be or include a passive die or an active die such as an application specific integrated circuit (ASIC) or any other type of active dies. The RDL 230 may electrically connect the substrate 10 and the substrate 20. In some arrangements, the RDL 230 includes one or more dielectric layers, a plurality of conductive layers in the dielectric layers, and a plurality of conductive vias connecting adjacent conductive layers. The conductive layers may include conductive pads and/or conductive pillars adjacent to and exposed by an upper surface and/or a bottom surface of the RDL 230. The conductive pads or conductive pillars of the RDL 230 may electrically connect to the UBMs 214 through the connection elements 240. In some arrangements, the RDL 230 includes conductive pads 231 electrically connected to the conductive pads 140 of the substrate 10. In some arrangements, the electronic component 210A includes a plurality of dies 211A stacked over and electrically connected, an encapsulant 212A encapsulating the dies 211A, and conductive pads 213A electrically connected to the connection elements 240. The dies 211A may include a top die exposed by the encapsulant 212A, a bottom die such as a logic die, and a plurality of memory dies stacked between the top die and the bottom die. In some arrangements, the dielectric layers may independently include an organic material, a solder mask, PI, an ABF, one or more molding compounds, one or more pre-impregnated composite fibers (e.g., a pre-preg material), BPSG, silicon oxide, silicon nitride, silicon oxynitride, USG, any combination thereof, or the like. The conductive layers, pads, vias, and/or pillars may independently include a conductive material such as a metal or metal alloy. Examples include Au, Ag, Al, Cu, or an alloy thereof. The encapsulant 220 and the underfill 250 may independently include an epoxy resin having fillers, a molding compound (e.g., an epoxy molding compound or other molding compound), polyimide, a phenolic compound or material, a material with a silicone dispersed therein, or a combination thereof. The connection elements 240 may include a solder material.

In some arrangements, each of the package structures 1 and 1A may include different regions. For example, a first region may include a homogeneous material (e.g., a semiconductor substrate, such as the substrate layer 211), and a second region may include a composite material (e.g., the encapsulant 220). The composite material may include a resin and a plurality of fillers. In some arrangements, a light absorption rate of the first region may be greater than a light absorption rate of the second region. In some arrangements, the first region may include a material (e.g., the composite material) having a thermal decomposition temperature lower than that of a material (e.g., the homogeneous material) of the second region. The first region may be referred to as an opaque region or an optical-semi-transmissive region, and the second region may be referred to as an optical-transmissive region. The optical-transmissive region may have a light transmittance greater than a light transmittance of the first region. The opaque region may include or correspond to an encapsulant, and the optical-transmissive region may include or correspond to an electronic component. In some arrangements, each of the package structures 1 and 1A may have a region R1 and a region R2 different from the region R1. The region R1 may be referred to as an opaque region, and the region R2 may be referred to as an optical-transmissive region. In some arrangements, the region R1 partially overlaps the region R2. In some arrangements, an overlapping area of the region R1 and the region R2 has a uniform or non-uniform width (e.g., widths W1, W1', W2, and W2') equal to or less than about 0.5 mm, e.g., from about 0.3 mm to about 0.5 mm. The widths W1, W1', W2, and W2' may be the same or different. In some arrangements, the region R1 vertically overlaps the encapsulant 220. In some arrangements, the region R2 vertically overlaps the electronic components 210 and 210A. In some arrangements, the vacuum suction structure (e.g., the vacuum suction passages 710H and 710HA) of the supporter 710 is free from vertically overlapping the region R1 and the region R2. In some arrangements, each of the package structures 1 and 1A may further include a plurality of first connection elements 310 in the region R1 and a plurality of connection elements 320 in the region R2. The connection elements 310 and 320 may be connected to the active surface of the substrate 20. In some arrangements, the connection elements 310 and 320 may be or include one or more solder materials. The connection elements 310 and 320 may be or include solder joints, such as solder balls, solder bumps, or the like. In some arrangements, as shown in an enlarged block B, the substrate 10 is spaced apart from the substrate 20 by a distance D1 defined by a maximum height of the connection elements 310 and/or 320. In some arrangements, one or more of the connection elements 310 and 320 may be spaced apart from the conductive pads 140. In some arrangements, one or more of the connection elements 310 and 320 may be misaligned with the corresponding conductive pad 140.

Figure 3:
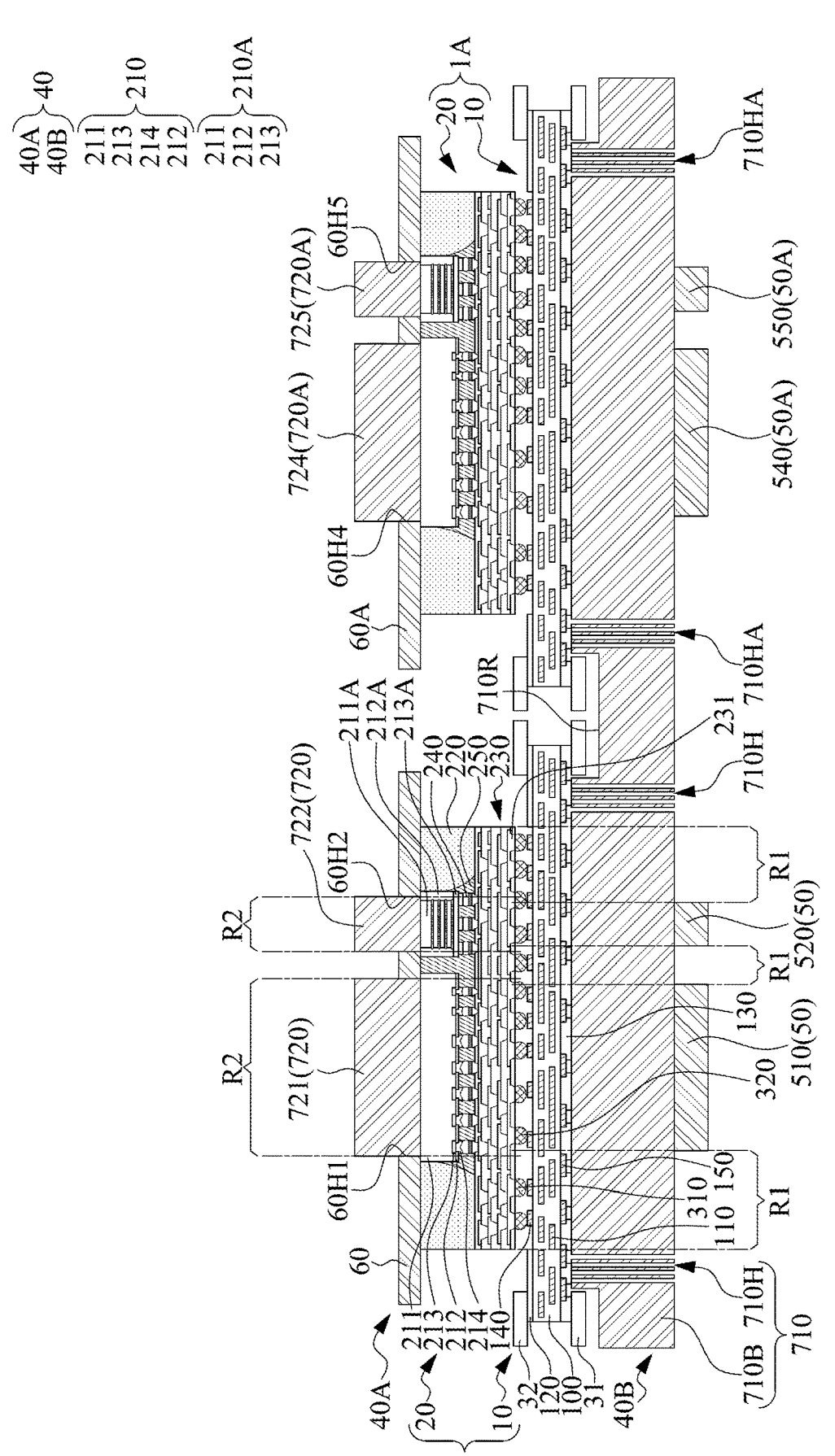

Referring to FIG. 3, package structures 1 and 1A may be guided to contact the shielding regions 60 and 60A (or the upper masks). In some arrangements, the package structures 1 and 1A are guided to contact the shielding regions 60 and 60A (or the upper masks) before irradiating the package structures 1 and 1A. In some arrangements, the shielding regions 60 and 60A (or the upper masks) contact the encapsulants 220. In some arrangements, the shielding regions 60 and 60A (or the upper masks) further cover or contact peripheral portions of the electronic components 210 and 210A.

In some arrangements, top surfaces of the electronic components 210 and 210A are guided to contact the compression elements 720. In some arrangements, the compression elements 720 are configured to allow at least an energy beam to pass through the electronic components 210 and 210A and also reduce warpage of the package structures 1 and 1A. In some arrangements, the shielding regions 60 and 60A (or the upper masks) further contact a portion (e.g., a peripheral portion) of the top surface of the electronic component 210 and a portion (e.g., a peripheral portion) of the top surface of the electronic component 210A. In some arrangements, the shielding regions 60 and 60A (or the upper masks) are configured to reduce an irradiation amount reaching the region R1.

In some arrangements, the supporter 710 is configured to guide the package structures 1 and 1A toward a mask structure (i.e., the upper structure 40A) of the processing apparatus 40. In some arrangements, the package structures 1 and 1A may be guided to contact the shielding regions 60 and 60A (or the upper masks) by pushing the package structure 1 and 1A toward the shielding regions 60 and 60A by the supporter 710. In some arrangements, the vacuum suction structure (e.g., the vacuum suction passages 710H and 710HA) of the supporter 710 is configured to allow the supporter 710 to adhere to the package structures 1 and 1A. The package structures 1 and 1A may be adhered to the supporter 710 by introducing vacuum to the vacuum suction passages 710H and 710HA. In some arrangements, after the supporter 710 is adhered to the package structures 1 and 1A through vacuum suction, the supporter 710 is configured to further push the package structures 1 and 1A toward and contact the shielding regions 60 and 60A (or the upper masks) of the upper structure 40A. In some arrangements, the supporter 710 is configured to allow an energy beam to pass through and reach the region R1.

Figure 4:
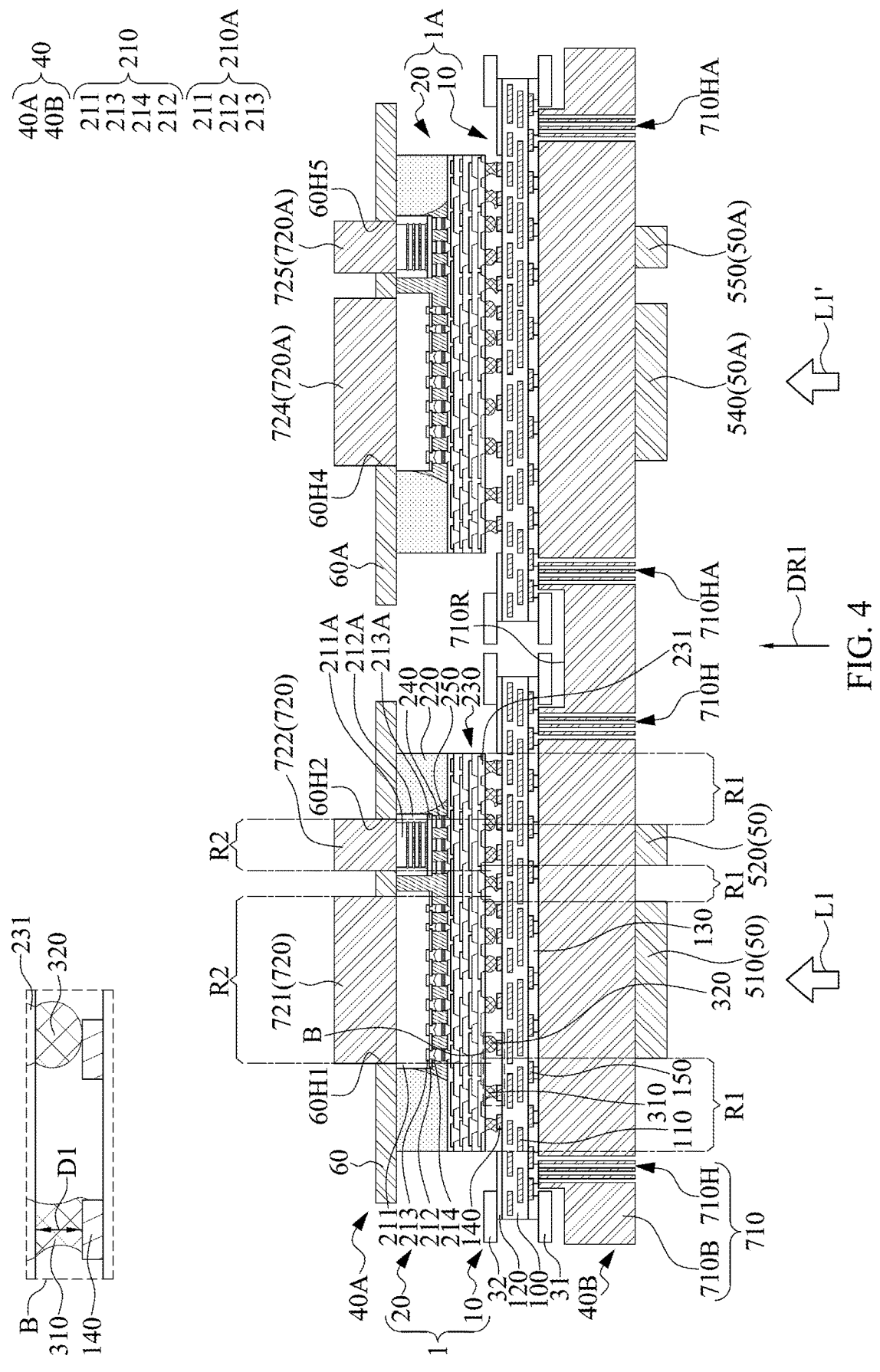

Referring to FIG. 4, at least one of the package structures 1 and 1A may be irradiated by at least a light beam (e.g., an energy beam L1). The package structure may be irradiate along a first path (e.g., that path in which the energy beam L1 irradiates). In the first path, the region R2 may be shielded without shielding the region R1. In some arrangements, the package structure 1 is irradiated by the energy beam L1 from or along a direction DR1 (i.e., a direction from outside of the supporter 710 toward the substrate 10). The direction DR1 may be a direction from the active surface toward the backside surface of the substrate 10. In some arrangements, the region R1 of the package structure 1 is irradiated by the energy beam L1 from the direction DR1. In some arrangements, the package structure has a first surface and a second surface opposite to the first surface, and the energy beam L1 passes through a portion of the first surface of the package structure corresponding to the region R1. In some arrangements, the connection elements 310 are irradiated by the energy beam L1 from the direction DR1. In some arrangements, the energy beam L1 passes through the wiring structure 110 to provide heat to the region R1, such that the connection elements 310 may melt or at least partially melt. In some arrangements, the energy beam L1 provides heat to the wiring structure 110, and then the connection elements 310 in the region R1 may be heated by the heat transmitted from the wiring structure 110. In some arrangements, the connection elements 310 contact the conductive pads 140 and have irregular shapes. The connection element 310 may have one or more curved lateral surfaces. The connection element 310 may have one or more recesses recessed toward an inner portion of the connection element 310. A portion of an upper surface and a lateral surface of the conductive pad 140 may be exposed by the connection element 310. In some arrangements, at this stage, the connection elements 320 in the region R2 are not heated by any energy beam, and thus the shapes of the connection elements 320 remain substantially unchanged. In some arrangements, the distance D1 between the substrate 10 and the substrate 20 remains unchanged since the distance D1 is defined by a maximum height of the connection elements 320. In some arrangements, the energy beam L1 may be applied to the package structure along a path (also referred to as "a first path") that passes a reflowable material (e.g., the connection elements 310) to only irradiate the region R1 without irradiating the region R2. In some arrangements, the region R2 is within a coverage area of an electronic component (e.g., the electronic components 210 and 210A) of the package structure in a top view perspective. In some arrangements, the region R2 is shielded by a lower mask from being irradiated by the energy beam L1 when irradiating the region R1 by the energy beam L1.

In some arrangements, the processing apparatus 40 is configured to reduce an irradiation amount reaching the region R2. In some arrangements, the shielding region 50 (or the lower mask) defines a transmission region (also referred to as "an optical-transmissive region") configured to allow the energy beam L1 to pass through and reach the region R1 of the package structure 1. In some arrangements, the supporter 710 is configured to allow the energy beam L1 to pass through and reach the region R1 of the package structure 1. In some arrangements, the shielding region 50 (or the lower mask) is configured to reduce an irradiation amount reaching the region R2 of the package structure 1. In some arrangements, the shielding region 50 (or the lower mask) is configured to reduce an irradiation amount from the energy beam L1 reaching the region R2 of the package structure 1. In some arrangements, the shielding region 50 (or the lower mask) is configured to block the irradiation the energy beam L1 from reaching the region R2 of the package structure 1. In some arrangements, at least 80% of an area of the region R2 of the package structure 1 is free from being irradiated by the energy beam L1.

In some arrangements, the shielding region 50A (or the lower mask) defines a transmission region (also referred to as "an optical-transmissive region") configured to allow the energy beam L1' to pass through and reach the region R1 of the package structure 1A. In some arrangements, the supporter 710 is configured to allow the energy beam L1' to pass through and reach the region R1 of the package structure 1A. In some arrangements, the shielding region 50A (or the lower mask) is configured to reduce an irradiation amount reaching the region R2 of the package structure 1A. In some arrangements, the shielding region 50A (or the lower mask) is configured to reduce an irradiation amount from the energy beam L1' reaching the region R2 of the package structure 1A. In some arrangements, the shielding region 50A (or the lower mask) is configured to block the irradiation of the energy beam L1' from reaching the region R2 of the package structure 1A. In some arrangements, at least 80% of an area of the region R2 of the package structure 1A is free from being irradiated by the energy beam L1'.

In some arrangements, the region R1 of the package structure 1 is irradiated by the energy beam L1, and the region R1 of the package structure 1A is irradiated by an energy beam L1'. In some arrangements, the region R1 of the package structure 1 is irradiated by the energy beam L1 before the region R1 of the package structure 1A is irradiated by the energy beam L1'. In some arrangements, the region R1 of the package structure 1A is irradiated by the energy beam L1' after irradiation of region R1 of the package structure 1 by the energy beam L1 is finished. In some other arrangements, the energy beam L1' is not provided, and the region R1 of the package structure 1 and the region R1 of the package structure 1A are irradiated by a single energy beam L1 simultaneously or in the same operation. In some arrangements, the irradiation time, the irradiation power, or other irradiation conditions for the region R1 of the package structure 1 and the region R1 of the package structure 1A may be the same or different depending on actual applications.

Figure 5:
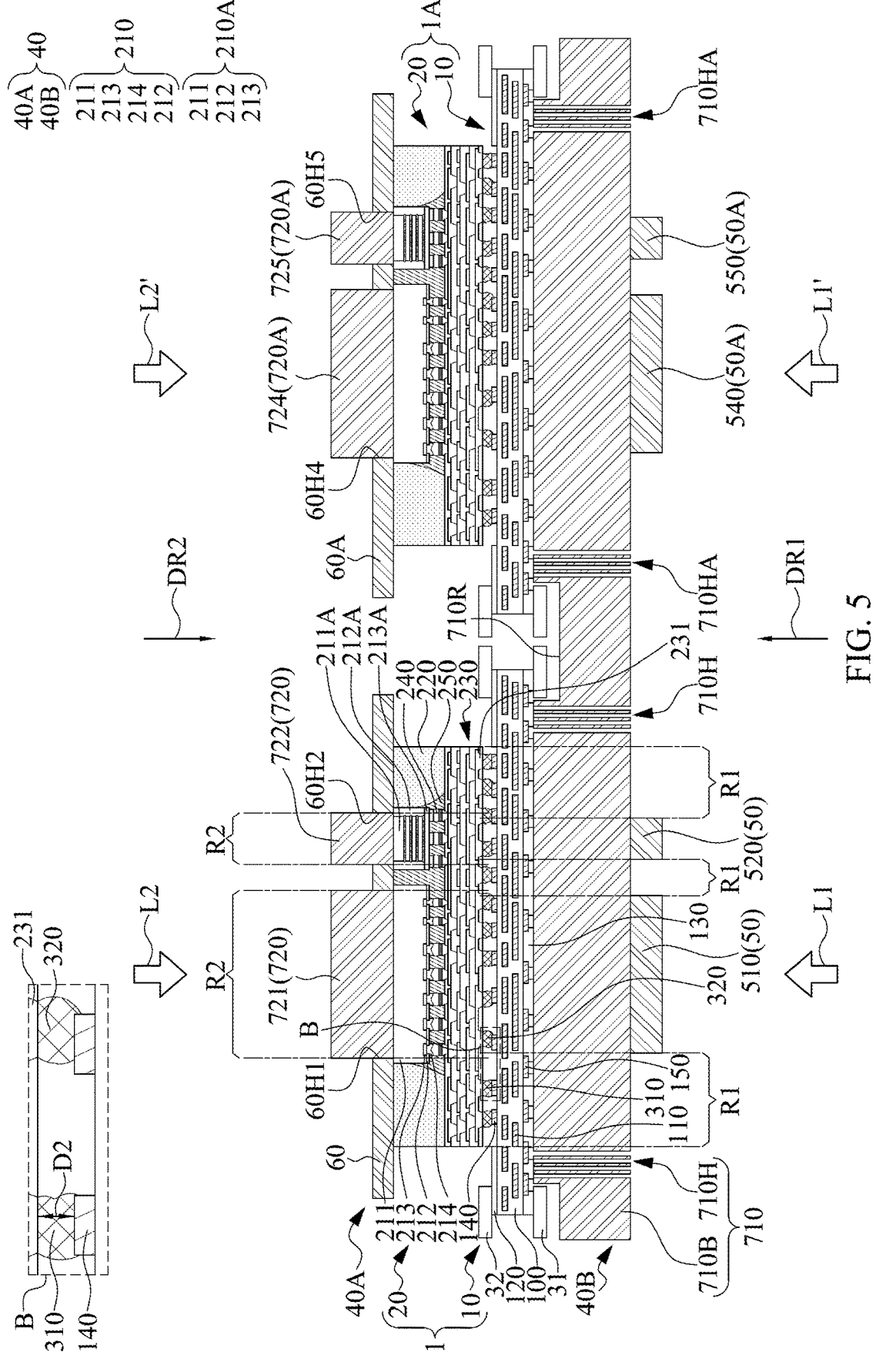

Referring to FIG. 5, thermal energy may be applied to at least one of the package structures 1 and 1A by a heat source (e.g., a light beam, for example, an energy beam L2) from or along a direction DR2 different from direction DR1. In some arrangements, the direction DR1 is substantially opposite to the direction DR2 (i.e., a direction from outside of the compression element 720 toward the substrate 20). In some arrangements, thermal energy may be applied to the region R2 of the package structure 1 by the heat source (e.g., the energy beam L2) from the direction DR2. In some arrangements, thermal energy may be applied to the connection elements 320 of the package structure 1 by the heat source (e.g., the energy beam L2) from the direction DR2. In some arrangements, the heat source is or includes a light beam (e.g., an energy beam L2). The package structure may be irradiate along a second path (e.g., that path in which the energy beam L2 irradiates). In the second path, the region R1 may be shielded without shielding the region R2. A surface of the encapsulant 220 may be covered by the upper mask to shield the region R1. A portion of the electronic component 210 in the second path may be shielded. The step of shielding the region R1 without shielding the region R2 in the path is later than the step of shielding the region R2 without shielding the region R1 in the first path. In some arrangements, the energy beam L2 is different from the energy beam L1. In some arrangements, the connection elements 320 are irradiated by the energy beam L2 from the direction DR2. In some arrangements, the energy beam L2 passes through a first portion of the second surface of the package structure corresponding to the region R2 without passing through the region R1. In some arrangements, a second portion of the second surface of the package structure corresponding to the region R1 is shielded when irradiating the energy beam L2. In some arrangements, the energy beam L2 passes through the electronic components 210 and 210A to provide heat to the region R2, such that the connection elements 320 melt to bond the conductive pads of the substrate 20 to the conductive pads 140 of the substrate 10. In some arrangements, the energy beam L2 provides heat to the electronic components 210 and 210A, and then the connection elements 320 in the region R2 may be heated by the heat transmitted from the electronic components 210 and 210A. In some arrangements, the region R1 is free from being irradiated by the energy beam L2. In some arrangements, the energy beam L2 is free from passing through the encapsulant 220 of the substrate 20. In some arrangements, the energy beam L2 is applied to the package structure along a path (also referred to as "a second path") without passing the reflowable material (e.g., the connection elements 310) to only irradiate the region R2 without irradiating the region R1. In some arrangements, the region R1 is shielded from being irradiated by the energy beam L2 when irradiating the region R2 by the energy beam L2.

In some arrangements, the processing apparatus 40 is configured to reduce an irradiation amount reaching the region R1. In some arrangements, the processing apparatus 40 is configured to reduce an irradiation amount (also referred to "a first irradiation amount") reaching the region R1 and an irradiation amount (also referred to "a second irradiation amount") reaching the region R2 respectively from opposite sides of the package structures 1 and 1A. In some arrangements, the shielding regions 50 and 50A (or the lower masks) are configured to reduce the irradiation amount reaching the region R2, and the shielding regions 60 and 60A (or the upper masks) are configured to reduce the irradiation amount reaching the region R1.

In some arrangements, the shielding region 60 (or the upper mask) defines a transmission region (also referred to as "an optical-transmissive region," e.g., the openings 60H1, 60H2, and 60H3) configured to allow the energy beam L2 to pass through and reach the region R2 of the package structure 1. In some arrangements, a surface of the encapsulant 220 is covered with the upper mask to shield the region R1 when irradiating the region R2 by the energy beam L2. In some arrangements, the compression elements 720 are configured to allow the energy beam L2 to pass through and reach the region R2 of the package structure 1. In some arrangements, the shielding region 60 (or the upper mask) is configured to reduce an irradiation amount reaching the region R1 of the package structure 1. In some arrangements, the shielding region 60 (or the upper mask) is configured to reduce an irradiation amount from the energy beam L2 reaching the region R1 of the package structure 1. In some arrangements, the shielding region 60 (or the upper mask) is configured to block irradiation of the energy beam L2 from reaching the region R1 of the package structure 1.

In some arrangements, applying the thermal energy (or the heat) to the region R2 of the package structure 1 by the energy beam L2 starts after irradiation of the region R1 of the package structure 1 by the energy beam L1. In some arrangements, applying the thermal energy (or the heat) to the region R2 starts when the connection elements 310 deform from the heat of the energy beam L1. In some arrangements, applying the thermal energy (or the heat) to the region R2 starts when a temperature of the connection elements 310 (or the solders) is higher than about 100° C. and lower than a melting point of the connection elements 310 (or the solders), e.g., from about 150° C. to about 180° C. In some arrangements, the overlapping area of the region R1 and the region R2 is free from vertically overlapping the encapsulant 220. In some arrangements, a projection of the overlapping area of the region R1 and the region R2 is entirely within the range covered by the electronic components 210 and 210A. In some arrangements, the overlapping area of the region R1 and the region R2 is irradiated by the energy beam L1 from the direction DR1 and heated by the heat source form the direction DR2. In some arrangements, the overlapping area of the region R1 and the region R2 is irradiated both by the energy beam L1 from the direction DR1 and the energy beam L2 from the direction DR2. In some arrangements, application of thermal energy (or heat) to the region R2 of the package structure 1 by the energy beam L2 and irradiation of the region R1 of the package structure 1 by the energy beam L1 stop or are finished at substantially the same time.

In some arrangements, irradiating the region R2 of the package structure by the energy beam L2 is performed later than irradiating the region R1 of the package structure by the energy beam L1. In some arrangements, the region R1 is within a coverage area of the encapsulant 220 and partially overlapping the coverage area of the electronic component 210 in the top view perspective. In some arrangements, the step of irradiating the package structure along the direction DR2 is later than the step of irradiating the package structure along the direction DR1. In some arrangements, the energy beam L2 starts to provide heat to the connection elements 320 after the energy beam L1 starts to provide heat to the connection elements 310, and the energy beam L1 keeps providing heat to the connection elements 310 while the energy beam L2 is providing heat to the connection elements 320. In some arrangements, the connection elements 320 deform from the heat of the energy beam L2. In some arrangements, the connection elements 310 further deform from the heat provided by the energy beam L1 when the connection elements 320 are heated by the energy beam L2. After the connection elements 310 and 320 both melt from the heat and contact the conductive pads 140, the irradiation by the energy beams L1 and L2 may stop, and the conductive pads of the substrate 20 and the conductive pads 140 of the substrate 10 are bonded through the connection elements 310 and 320. In some arrangements, irradiating the region R2 of the package structure by the energy beam L2 stops before irradiating the region R1 of the package structure by the energy beam L1 stops. In some arrangements, the step of stopping irradiating the package structure along the direction DR2 is earlier than the step of stopping irradiating the package structure along the direction DR1. In some arrangements, the irradiation of the energy beams L1 and L2 stops when a temperature of the connection elements 310 and 320 equals or exceeds a melting point of the connection elements 310 and 320 (or the solders), e.g., from about 260° C. to about 280° C. or 300° C. According to some arrangements of the present disclosure, the irradiation of the energy beam L2 stops before the irradiation of the energy beam L1 stops, and thus undesired excess heat from the energy beam L2 can be prevented from being transmitted to the encapsulant 220. Therefore, the encapsulant 220 can be prevented from being overheated.

In some arrangements, an irradiation time of the energy beam L1 is longer than an irradiation time of the energy beam L2. In some arrangements, the irradiation time of the energy beam L2 is about 1.5-2 seconds. In some arrangements, a power density of the energy beam L1 is less than a power density of the energy beam L2. In some arrangements, the power density of the energy beam L1 is about 70% to about 80% of the power density of the energy beam L2. According to some arrangements of the present disclosure, with the aforesaid designs of the irradiation time and/or the power densities, the dielectric layers within the substrate 10 can be prevented from being damaged by overheating from the energy beam L1, and thus the substrate 10 can be bonded to the substrate 20 through the connection elements 310 and 320 by irradiation of the energy beams L1 and L2 with an increased UPH and without being overheated.

In some arrangements, the connection elements 310 and 320 may have irregular shapes. In some arrangements, the connection elements 310 and 320 may have one or more curved lateral surfaces. The connection elements 310 and 320 may have one or more convex lateral surfaces. A portion of an upper surface and a lateral surface of the conductive pad 140 may be exposed by the connection element 310. A portion of an upper surface and a lateral surface of the conductive pad 140 may be exposed by the connection element 320. In some arrangements, a distance D2 between the substrate 10 and the substrate 20 is reduced compared to the distance D1 between the substrate 10 and the substrate 20 prior to irradiation of the region R2 by the energy beam L2. Since the connection elements 310 and 320 both melt and soften, the substrates 10 and 20 may approach each other with a reduced distance D2 therebetween resulting from the deformed connection elements 310 and 320.

In some arrangements, the shielding region 60A (or the upper mask) defines a transmission region (also referred to as "an optical-transmissive region," e.g., the openings 60H4, 60H5, and 60H6) configured to allow the energy beam L2' to pass through and reach the region R2 of the package structure 1A. In some arrangements, the compression elements 720 are configured to allow the energy beam L2' to pass through and reach the region R2 of the package structure 1A. In some arrangements, the shielding region 60A (or the upper mask) is configured to reduce an irradiation amount reaching the region R1 of the package structure 1A. In some arrangements, the shielding region 60A (or the upper mask) is configured to reduce an irradiation amount from the energy beam L2' reaching the region R1 of the package structure 1A. In some arrangements, the shielding region 60A (or the upper mask) is configured to block irradiation from the energy beam L2' from reaching the region R1 of the package structure 1A.

The operations for irradiating the package structure 1A by the energy beams L1' and L2' are the same as or similar to the operations performed on the package structure 1 described here, and thus description thereof is omitted herefrom. In some arrangements, the region R2 of the package structure 1 is irradiated by the energy beam L2, and the region R2 of the package structure 1A is irradiated by an energy beam L2'. In some arrangements, the region R2 of the package structure 1 is irradiated by the energy beam L2 before the region R2 of the package structure 1A is irradiated by the energy beam L2'. In some arrangements, the region R2 of the package structure 1A is irradiated by the energy beam L2' after irradiation of the region R2 of the package structure 1 by the energy beam L2 is finished. In some other arrangements, no energy beam L2' is provided, and the region R2 of the package structure 1 and the region R2 of the package structure 1A are irradiated by a single energy beam L2 simultaneously or in the same operation. In some arrangements, after the package structure 1 is irradiated by the energy beams L1 and L2, the package structure 1A is irradiated by the energy beams L1' and L2'. In some arrangements, the irradiation time, the irradiation power, or other irradiation conditions for the region R2 of the package structure 1 and the region R2 of the package structure 1A may be the same or different depending on actual applications. In some arrangements, the order or sequence for performing the irradiations by the energy beams L1, L2, L1', and L2' may vary depending on actual applications.

In some arrangements, the light beams (e.g., the energy beams L1 and L2) may be applied with a laser equipment. The laser equipment may include at least a laser head disposed with a diffuser plate. The laser head may emit a highly localized beam that then passes through the diffuser plate before reaching the package structure. The diffuser plate may diffuse the light intensity distribution of the highly localized beam and turn it into a light beam that can provide a relatively large coverage range of the package structure. The laser head with the diffuser plate may be turned on and moved to one or more predetermined positions or locations to apply the light beams (e.g., the energy beams L1 and L2) to the package structure to irradiate regions of the package structure.

Figure 6:
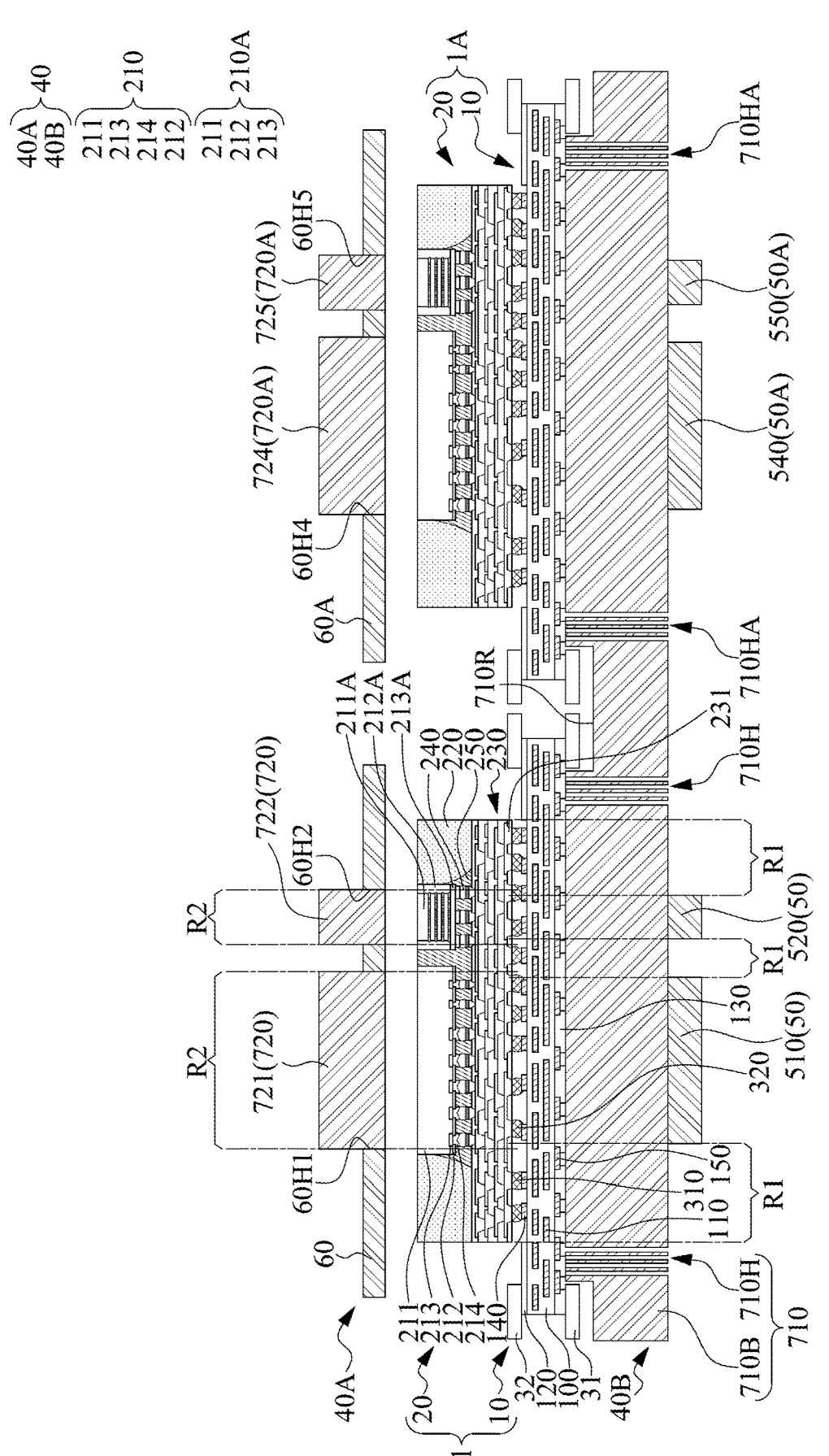

Referring to FIG. 6, the package structures 1 and 1A may be removed or moved away from the upper structure 40A. In some arrangements, the package structures 1 and 1A are supported by and adhered to the supporter 710, and the supporter 710 is lowered to move the package structures 1 and 1A away from the upper structure 40A.

Figure 7:
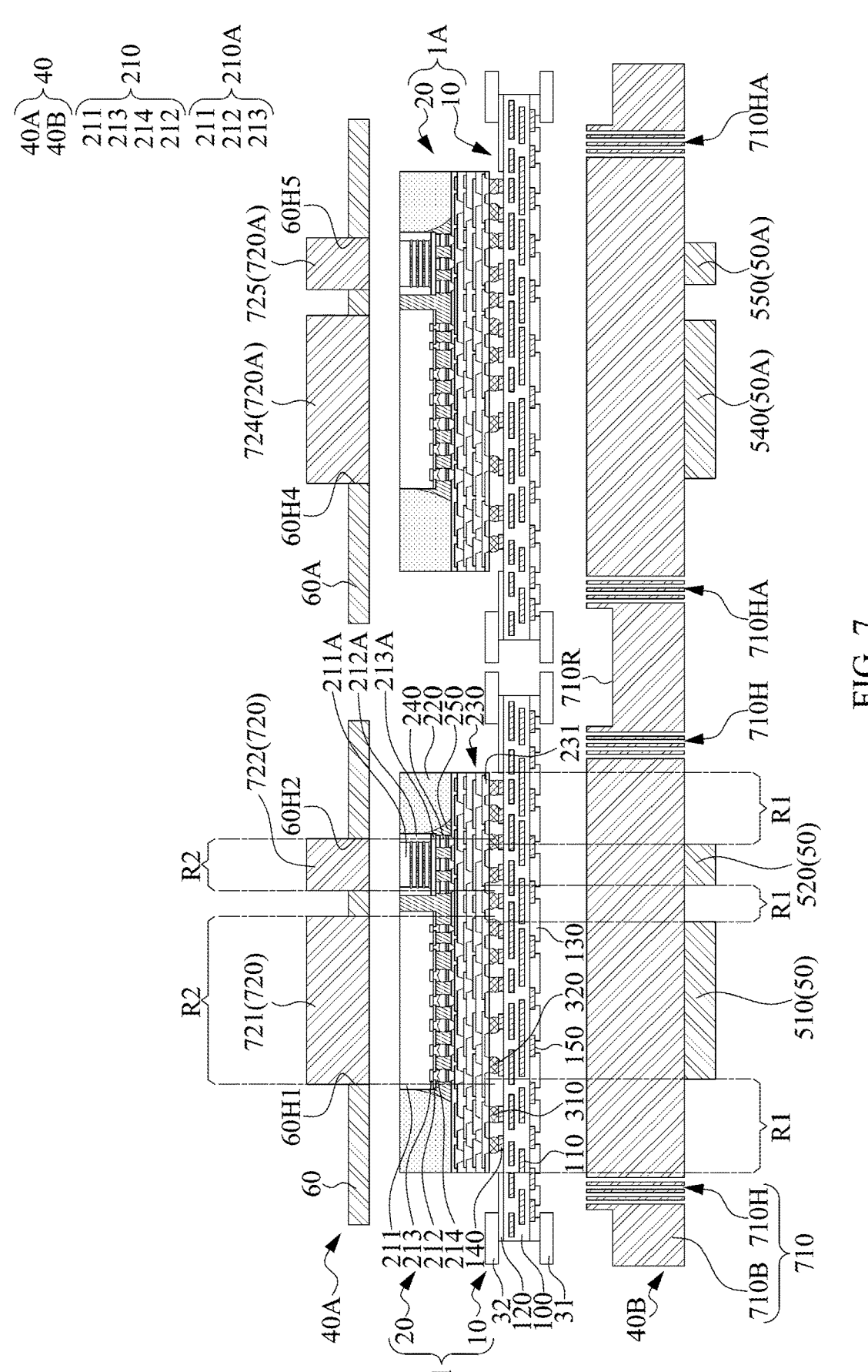

Referring to FIG. 7, the package structures 1 and 1A may be removed from or released from the supporter 710 and transported out of the processing apparatus 40. In some arrangements, the introduction of vacuum may be stopped, by for example introducing gas into the vacuum suction passages 710H and 710HA, to detach the package structures 1 and 1A from the supporter 710.

In some other arrangements, referring to FIGS. 4-5, the order of irradiation of the energy beam L1 and the energy beam L2 can be switched, as long as the irradiation time of the energy beam L1 is longer than the irradiation time of the energy beam L2.

In cases in which a package structure includes solder between a substrate and a molded device including a device region and an encapsulant, the solders may be heated by laser energy to bond the substrate and the molded device. However, the encapsulant may be easily damaged, deteriorated, or embrittled by laser energy. If the laser beam originates outside of the molded device and passes through the device region of the molded device without passing through the encapsulant, the encapsulant can be protected from damage from heat of the laser beam. However, while the device region is bonded to the substrate through solders heated by the laser beam, other solders under the encapsulant are not heated by the laser beam, and thus the encapsulant is not bonded to the substrate. On the other hand, if the laser beam originates outside of the substrate, the laser beam only passes through the substrate without passing through the encapsulant. Although the encapsulant may be protected from heat damage, the equivalent thermal conductivity of the substrate is relatively low, the heat transmission through the substrate is relatively slow, and thus the unit per hour (UPH) of the process is decreased, which adversely increases the processing time. In order to increase the UPH, the solders may be heated by laser beams from opposite sides of the package structure. However, the laser beam that passes through the encapsulant may damage the molded device, and portions of the substrate and the device region of the molded device may be irradiated by the laser beams from both sides of the package structure and thus be overheated. The package structure may be damaged accordingly, and yield decreased.

According to some arrangements of the present disclosure, by irradiating different regions of the package structure by energy beams from different directions, the connection elements can be heated uniformly, the package structure can be protected from being overheated, and the UPH can be increased.

In addition, according to some arrangements of the present disclosure, two different regions of the package structure that are almost free from vertically overlapping are irradiated by energy beams from substantially opposite directions, respectively. As such, the package structure can be heated uniformly, and both of the regions of the package structure can be protected from overheating. Therefore, the UPH and yield can be increases.

Moreover, according to some arrangements of the present disclosure, one region shields the electronic components from irradiation of an energy beam, and the other region shields the encapsulant from irradiation of the other energy beam. Therefore, both of the electronic components and the encapsulant can be protected from overheating, and thus the yield can be increased.

Further, according to some arrangements of the present disclosure, the shielding regions (or the upper masks) proximal to the encapsulant further cover or contact a portion (e.g., peripheral portions) of the electronic component, such as an overlapping area of the two different regions of the package structure is free from vertically overlapping the encapsulant. Therefore, the encapsulant can be entirely protected from being irradiated by energy beams from both directions, and thus the encapsulant can be protected from heat damage.

FIG. 8A, FIG. 8B, FIG. 9, FIG. 10, FIG. 11, FIG. 12, and FIG. 13 illustrate various stages of an exemplary method for manufacturing a package structure in accordance with some arrangements of the present disclosure. To streamline the description and for the convenience of comparison between various embodiments of the present disclosure, similar components in the following examples bear the same numerals, and may not be redundantly described.

Figure 8A:
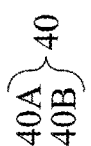
FIG. 8A, FIG. 8B, FIG. 9, FIG. 10, FIG. 11, FIG. 12, and FIG. 13 illustrate various stages of an exemplary method for manufacturing a package structure in accordance with some arrangements of the present disclosure.
Figure 8A:
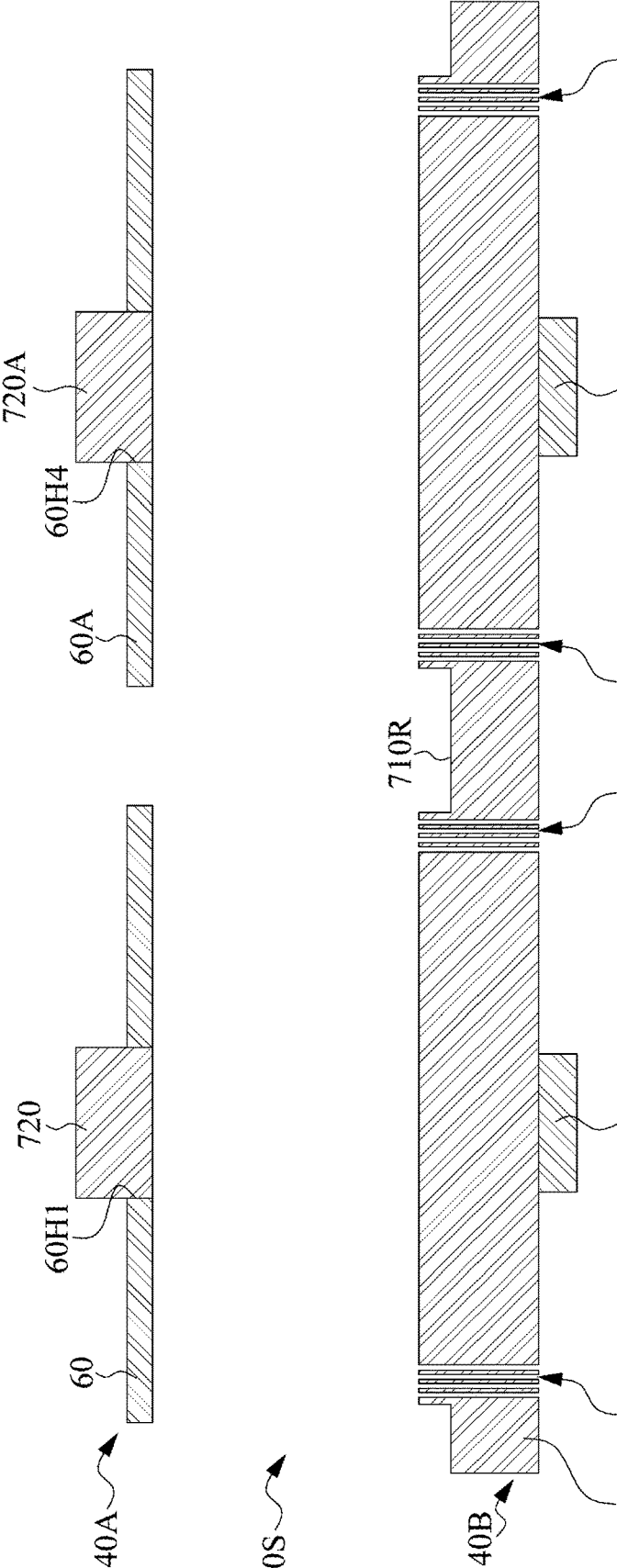
Figure 8B:
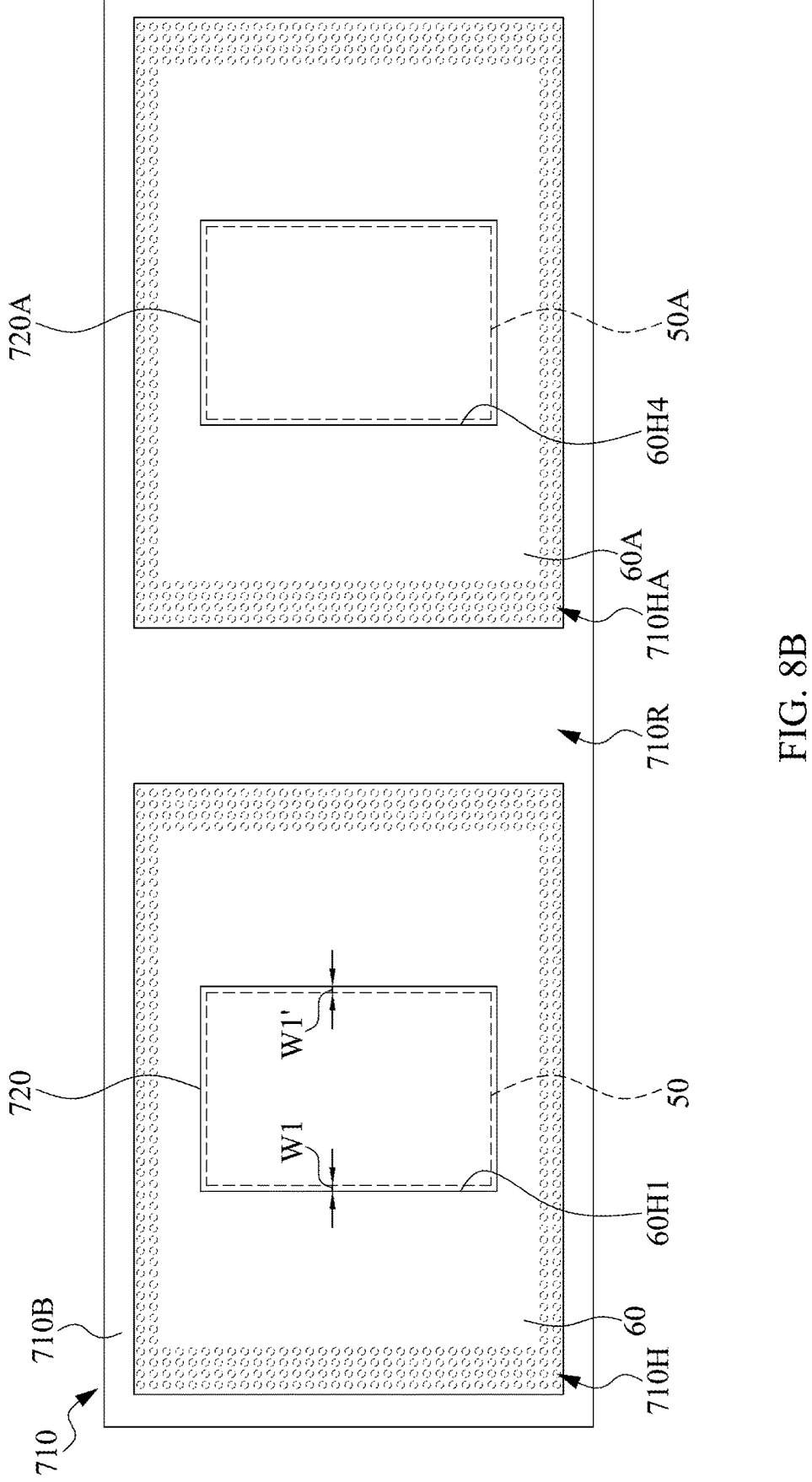

FIG. 8A and FIG. 8B, which illustrate various stages of an exemplary method for manufacturing a semiconductor package, are a cross-section and top view respectively of a processing apparatus 40 which may be provided thereby. Similar to the processing apparatus 40 illustrated in FIGS. 1A and 1B, the processing apparatus 40 includes an upper structure 40A and a lower structure 40B.

In some arrangements, the upper structure 40A includes a plurality of optical-transmissive regions and a plurality of shielding regions. The optical-transmissive regions may be or include regions of openings 60H1 and 60H4 (also referred to as "through holes"). The shielding regions may be or include shielding regions 60 and 60A (also referred to as "masks," "upper masks," or "top masks"). The masks (i.e., the shielding regions 60 and 60A) may define the openings 60H1 and 60H4. In some arrangements, the upper structure 40A further includes a plurality of compression elements 720 and 720A (also referred to as "optical-transmissive compression elements") disposed within the optical-transmissive regions (or the openings 60H1 and 60H4) and configured to reduce a warpage of the one or more package structures during manufacture. In some arrangements, the compression elements 720 and 720A are or include quartz blocks and/or quartz layers. The designs (e.g., the patterns, the numbers, the shapes, and etc.) of the optical-transmissive regions and the shielding regions of the upper structure 40A may vary according to actual need and are not limited thereto.

In some arrangements, the lower structure 40B is disposed under the upper structure 40A. In some arrangements, the lower structure 40B includes a plurality of shielding regions 50 and 50A (also referred to as "masks," "lower masks," or "bottom masks") free from vertically overlapping the shielding regions 60 and 60A. In some arrangements, the lower structure 40B further includes a supporter 710 (also referred to as "an optical-transmissive supporter) configured to guide one or more package structures to contact the upper structure 40A during manufacture. In some arrangements, the supporter 710 includes a base layer 710B (also referred to as "an optical-transmissive base layer") and a vacuum suction structure. In some arrangements, the vacuum suction structure includes a plurality of vacuum suction passages 710H and 710HA (also referred to as "through holes") penetrating the base layer 710B. In some arrangements, the supporter 710 is between the shielding regions 60 and 60A (or the upper masks) and the shielding regions 50 and 50A (or the lower masks) and configured to reduce a warpage of one or more package structures during manufacture. In some arrangements, the shielding regions 60 and 60A (or the upper masks) and the shielding regions 50 and 50A (or the lower masks) are free from vertically overlapping. In some arrangements, the vacuum suction passages 710H and 710HA are free from vertically overlapping the shielding regions 50, 50A, 60, and 60A. In some arrangements, each of the compression elements 720 and 720A is disposed over each of the corresponding shielding regions 50 and 50A. In some arrangements, referring to FIG. 8B, each of the shielding regions 50 and 50A has an edge spaced apart from an edge of each of the corresponding openings 60H1 and 60H4 from a top view perspective. In some arrangements, referring to FIG. 8B, an area of each of the shielding regions 50 and 50A is less than an area of each of the corresponding openings 60H1 and 60H4 from a top view perspective. In some arrangements, the supporter 710 is or includes a quartz block and/or a quartz layer. In some arrangements, the supporter 710 is a single-piece block or layer. In some arrangements, the lower structure 40B may further include an optical-transmissive region that is within a range covered by the supporter 710 and free from being covered by the shielding region 50 from a top view perspective. The designs (e.g., the patterns, the numbers, the shapes, and etc.) of the optical-transmissive region and the shielding regions of the lower structure 40B may vary according to actual need and are not limited thereto.

Figure 9:
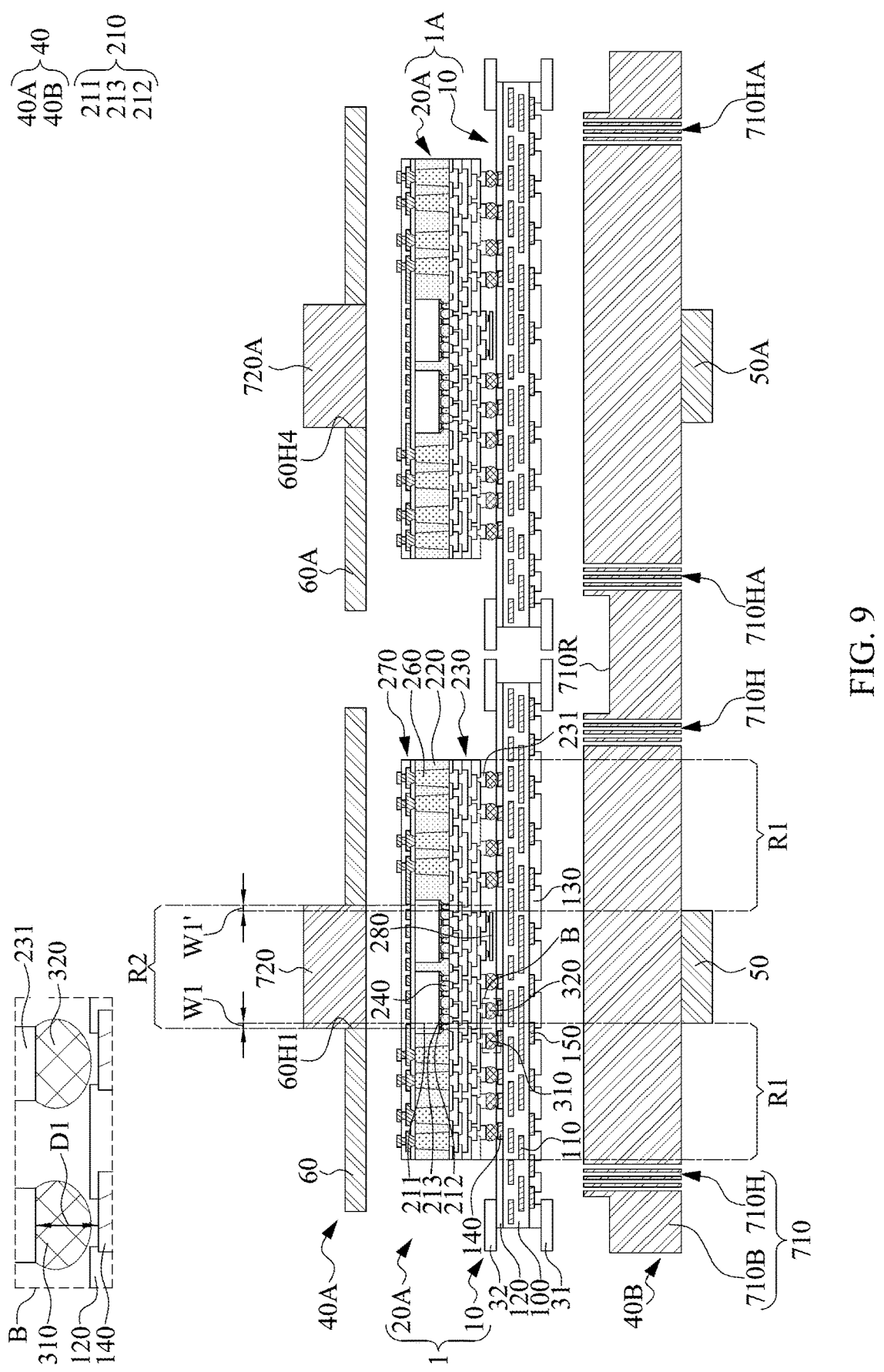

Referring to FIG. 9, operations similar to those illustrated in FIGS. 2A-2B may be performed to provide one or more package structures (e.g., package structures 1 and 1A). In some arrangements, each of the package structures 1 and 1A may include substrates 10 and 20A.

In some arrangements, the substrate 20A includes electronic components 210 and 280, an encapsulant 220, RDLs 230 and 270, connection elements 240, and conductive pillars 260. In some arrangements, the encapsulant 220 encapsulates the electronic components 210, the connection elements 240, and the conductive pillars 260. In some arrangements, the electronic component 210 includes a substrate layer 211 (e.g., a silicon-based layer), a passivation layer 212 on a bottom surface of the substrate layer 211, and conductive pads 213 exposed by openings of the passivation layer 212. The RDL 230 may electrically connect the substrate 10 and the substrate 20. The conductive pillars 260 may electrically connect the RDL 230 and the RDL 270. In some arrangements, the RDL 270 includes one or more dielectric layers, a plurality of conductive layers in the dielectric layers, and a plurality of conductive vias connecting adjacent conductive layers. The conductive layers may include conductive pads and/or conductive pillars adjacent to and exposed by an upper surface and/or a bottom surface of the RDL 270. The electronic component 280 may be electrically connected to the conductive pads 231 of the RDL 230 through conductive bumps or solders. The electronic component 280 may be or include an active die or a passive die such as resistor or any other types of passive dies. The conductive layers, pads, vias, and/or pillars may independently include a conductive material such as a metal or metal alloy. Examples include Au, Ag, Al, Cu, or an alloy thereof.

In some arrangements, each of the package structures 1 and 1A may have a region R1 and a region R2 different from the region R1. In some arrangements, the region R1 partially overlaps the region R2. In some arrangements, an overlapping area of the region R1 and the region R2 has a uniform or non-uniform width (e.g., widths W1 and W1') equal to or less than about 0.5 mm, e.g., from about 0.3 mm to about 0.5 mm. The widths W1 and W1' may be the same or different. In some arrangements, the region R1 vertically overlaps the encapsulant 220 and the conductive pillars 260. In some arrangements, the region R2 vertically overlaps the electronic components 210 and 280. In some arrangements, the substrate 10 is spaced apart from the substrate 20A by a distance D1 defined by a maximum height of the connection elements 310 and/or 320.

Figure 10:
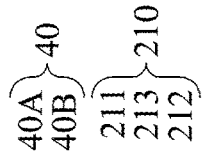

Referring to FIG. 10, operations similar to those illustrated in FIG. 3 may be performed to guide the package structures 1 and 1A to contact the shielding regions 60 and 60A (or the upper masks). In some arrangements, the shielding regions 60 and 60A (or the upper masks) contact the RDL 270. In some arrangements, the shielding regions 60 and 60A (or the upper masks) further cover peripheral portions of the electronic components 210. In some arrangements, a top surface of the RDL 270 is guided to contact the compression element 720 and the shielding region 60.

Figure 11:
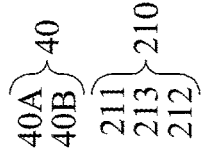

Referring to FIG. 11, operations similar to those illustrated in FIG. 4 may be performed to irradiate at least one of the package structures 1 and 1A by at least an energy beam (e.g., an energy beam L1) from a direction DR1. In some arrangements, the energy beam L1 provides heat to the wiring structure 110, and then the connection elements 310 in the region R1 may be heated by the heat transmitted from the wiring structure 110. The connection element 310 may have one or more curved lateral surfaces. The connection element 310 may have one or more recesses recessed toward an inner portion of the connection element 310. A portion of an upper surface of the conductive pad 140 may be exposed by the connection element 310. A portion of the softened connection element 310 may be filled in a recess defined by an opening of the dielectric layer 120 over the upper surface of the conductive pad 140. In some arrangements, the irradiation time, the irradiation power, or other irradiation conditions for the region R1 of the package structure 1 and the region R1 of the package structure 1A may be the same or different depending on actual applications.

Figure 12:
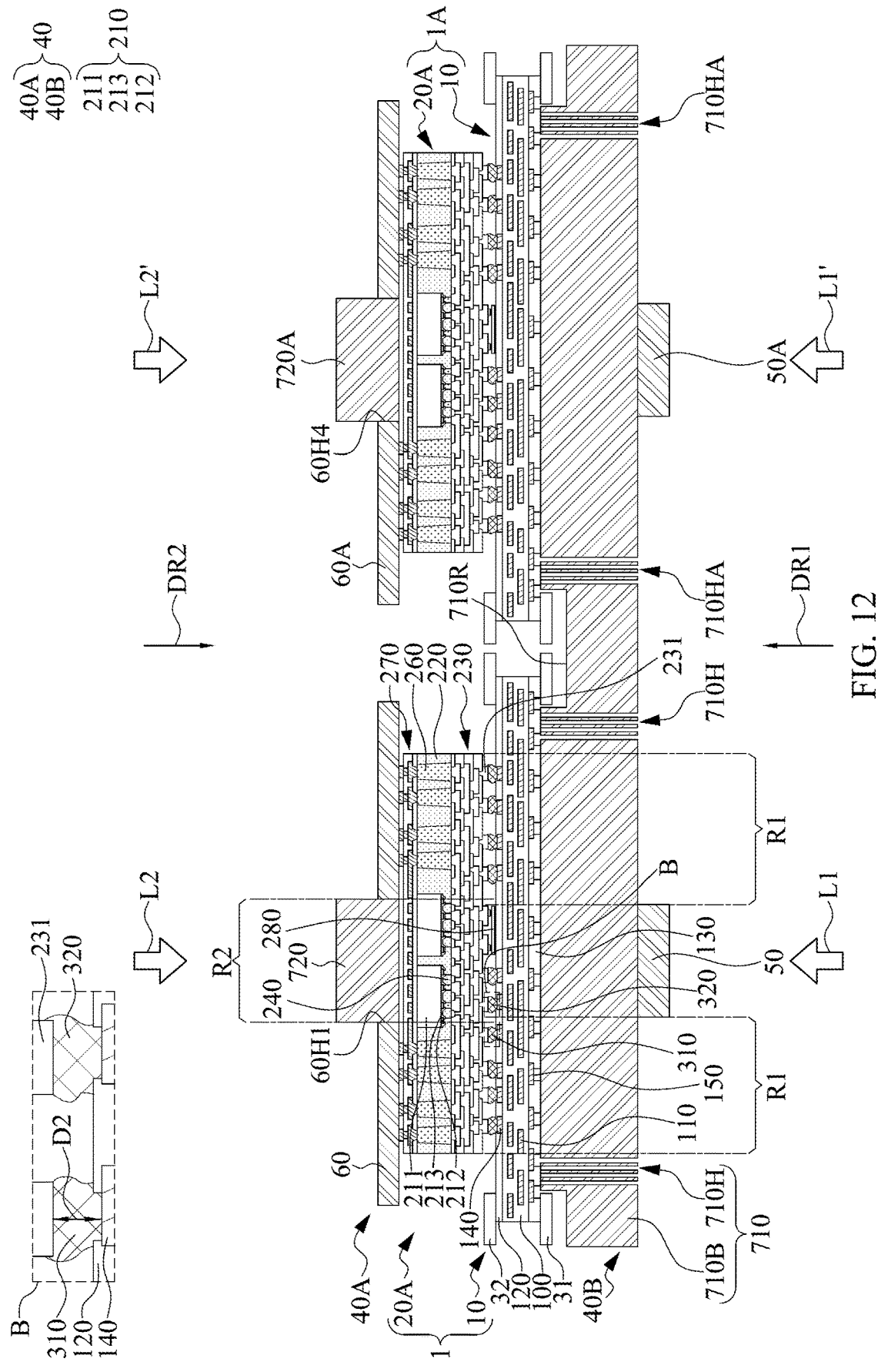

Referring to FIG. 12, operations similar to those illustrated in FIG. 5 may be performed to apply a thermal energy to at least one of the package structures 1 and 1A by a heat source (e.g., an energy beam L2) from a direction DR2 different from the direction DR1. In some arrangements, the energy beam L2 starts to provide heat to the connection elements 320 after the energy beam L1 starts to provide heat to the connection elements 310, and the energy beam L1 keeps providing heat to the connection elements 310 when the energy beam L2 is providing heat to the connection elements 320. After the connection elements 310 and 320 both melt by the heat and contact the conductive pads 140, the irradiation by the energy beams L1 and L2 may stop, and the conductive pads of the substrate 20 and the conductive pads 140 of the substrate 10 are bonded through the connection elements 310 and 320. The connection elements 310 and 320 may have one or more convex lateral surfaces. In some arrangements, the irradiation time, the irradiation power, or other irradiation conditions for the region R2 of the package structure 1 and the region R2 of the package structure 1A may be the same or different depending on actual applications. In some arrangements, the order or sequence for performing the irradiations by the energy beams L1, L2, L1', and L2' may vary depending on actual applications.

Figure 13:
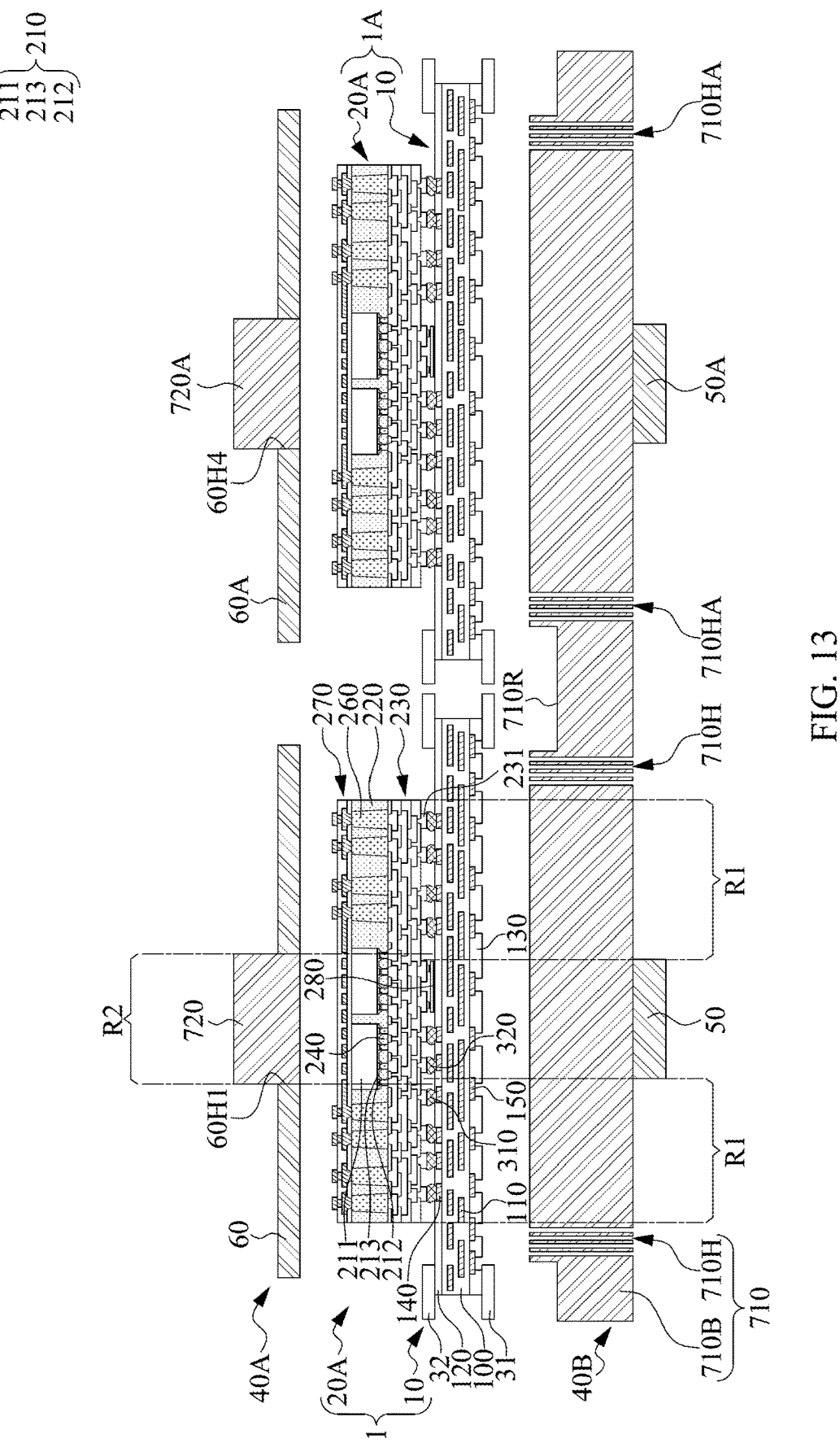

Referring to FIG. 13, operations similar to those illustrated in FIG. 6 and FIG. 7 may be performed to remove or move package structures 1 and 1A away from the upper structure 40A, remove or release the package structures 1 and 1A from the supporter 710, and transport the package structures 1 and 1A out of the processing apparatus 40.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method, comprising:

providing a package structure including a first region and a second region different from the first region, wherein the package structure comprises a package substrate having an active surface and a backside surface;

irradiating the package structure by a first light beam along a first direction from the active surface toward the backside surface, wherein the first light beam only irradiates the first region without irradiating the second region; and irradiating the package structure by a second light beam along a second direction different from the first direction, wherein the second light beam only irradiates the second region without irradiating the first region, wherein the package substrate comprises a semiconductor device and an encapsulant encapsulating the semiconductor device, and the second region is within a coverage area of the semiconductor device in a top view perspective.

2. The method as claimed in claim 1, wherein the step of irradiating the package structure along the second direction is later than the step of irradiating the package structure along the first direction.

3. The method as claimed in claim 2, further comprising stopping irradiating the package structure along the second direction earlier than stopping irradiating the package structure along the first direction.

4. The method as claimed in claim 1, wherein the first region is within a coverage area of the encapsulant and partially overlapping the coverage area of the semiconductor device in the top view perspective.

5. The method as claimed in claim 1, wherein the second region comprises a homogeneous material, and the first region comprises a composite material.

6. The method as claimed in claim 5 wherein a light absorption rate of the first region is greater than a light absorption rate of the second region.

* * * * *